United States Patent [19]
Kim

[11] Patent Number: 5,579,351
[45] Date of Patent: Nov. 26, 1996

[54] JITTER SUPPRESSION CIRCUIT

[75] Inventor: Hyung-Chui Kim, Kyunggi-do, Rep. of Korea

[73] Assignee: LG Information & Communications, Ltd., Seoul, Rep. of Korea

[21] Appl. No.: 545,067

[22] Filed: Oct. 19, 1995

[30] Foreign Application Priority Data

Oct. 19, 1994 [KR] Rep. of Korea .................. 94-26764

[51] Int. Cl.[6] ............................................. H04L 7/00
[52] U.S. Cl. ................................. 375/371; 375/346
[58] Field of Search ............................. 375/371, 376, 375/346, 226, 285, 362, 373; 327/149, 158, 161; 331/17, 25; 348/607; 455/296, 307

[56] References Cited

U.S. PATENT DOCUMENTS

| | | | |
|---|---|---|---|
| 4,639,939 | 1/1987 | Hirosaki et al. | 375/371 |
| 5,084,902 | 1/1992 | Aotani et al. | 375/350 |
| 5,103,185 | 4/1992 | Hrai | 327/292 |
| 5,128,968 | 7/1992 | Yoshida | 375/371 |

OTHER PUBLICATIONS

"Phase-Locked Loops", Edited by William C. Lindsey and Chak M. Chie, IEEE PRESS.

Primary Examiner—Stephen Chin
Assistant Examiner—Kevin Kim
Attorney, Agent, or Firm—Keck, Mahin & Cate

[57] ABSTRACT

A jitter suppression circuit for removing a jitter component contained in a synchronous reference clock signal which is supplied from a synchronization network to a phase locked loop circuit in a switching system, the phase locked loop circuit generating a clock signal in response to the synchronous reference clock signal from the synchronization network. The jitter suppression circuit removes the jitter component contained in the synchronous reference clock signal, to supply a pure synchronous reference clock signal to the phase locked loop circuit. Therefore, the phase locked loop circuit can output the clock signal at a stabilized state because it can control a phase of the clock signal with no effect of the jitter component.

9 Claims, 2 Drawing Sheets

JITTER SUPPRESSION CIRCUIT

BACKGROUND OF THE INVENTION

1. Field of the Invention

The present invention relates to a jitter suppression circuit for removing a jitter component contained in a synchronous reference clock signal which is supplied from a synchronization network to a phase locked loop (referred to hereinafter as PLL) circuit in a switching system to allow the PLL circuit to generate a clock signal in response thereto, so as to stabilize the clock signal from the PLL circuit.

2. Description of the Prior Art

Referring to FIG. 1, there is shown a block diagram of a conventional PLL circuit, which is designated by the reference numeral 10. As shown in this drawing, the conventional PLL circuit 10 comprises a phase difference detector 11, a microprocessor 12, a digital/analog (referred to hereinafter as D/A) converter 13, a voltage controlled oscillator (referred to hereinafter as VCO) 14, and a frequency divider 15. The frequency divider 15 divides the frequency of a clock signal from the VCO 14 and supplies the frequency-divided clock signal to the phase difference detector 11, which also receives a synchronous reference clock signal which is supplied from a synchronization network through a reference clock receiver 1 and a band pass filter 2. The phase difference detector 11 then detects the phase difference between the frequency-divided clock signal and the synchronous reference clock signal in one unit of predetermined time thereby generating phase difference detect data. The microprocessor 12 scans the phase difference detect data from the phase difference detector 11 each predetermined unit of time and analyzes it. The microprocessor 12 then produces correction data based on the analyzed result and supplies the produced correction data to the D/A converter 13. The D/A converter 13 converts the correction data from the microprocessor 12 into a voltage for the control of the VCO 14. The VCO 14 controls a phase of its output clock signal in response to the control voltage from the D/A converter 13. The clock signal from the VCO 14 is also supplied to a switching system through a frequency synthesizer/distributor circuit 3.

In the above-mentioned conventional PLL circuit 10, the clock signal from the VCO 14 can be stabilized when the synchronous reference clock signal has no jitter component. However, in the case where a jitter component is contained in the synchronous reference clock signal, it has an effect on the control of the VCO 14, resulting in a variation in the phase of the clock signal from the VCO 14. In this case, the clock signal from the VCO 14 cannot be stabilized.

SUMMARY OF THE INVENTION

Therefore, the present invention has been made in view of the above problem, and it is an object of the present invention to provide a jitter suppression circuit for removing a jitter component contained in a synchronous reference clock signal which is supplied from a synchronization network to a PLL circuit in a switching system to allow the PLL circuit to generate a clock signal in response thereto, so as to stabilize the clock signal from the PLL circuit.

In accordance with the present invention, the above and other objects can be accomplished by a provision of a jitter suppression circuit for removing a jitter component contained in a synchronous reference clock signal which is supplied from a synchronization network to a phase locked loop circuit in a switching system, the phase locked loop circuit generating a clock signal in response to the synchronous reference clock signal from the synchronization network, comprising first means for generating a first signal in response to the synchronous reference clock signal from the synchronization network and a frequency-divided one of the clock signal from the phase locked loop circuit; second means for delaying a phase of the first signal from the first means by a first desired angle to generate a second signal and delaying a phase of the synchronous reference clock signal from the synchronization network by a second desired angle to generate a third signal; third means for generating a fourth signal in response to the first signal from the first means and the synchronous reference clock signal from the synchronization network; fourth means for generating a fifth signal in response to the second and third signals from the second means; and fifth means for generating a sixth signal in response to the fourth signal from the third means and the fifth signal from the fourth means and outputting the generated sixth signal as a synchronous reference clock signal to the phase locked loop circuit.

The first means includes a multiplier for multiplying the synchronous reference clock signal from the synchronization network by the frequency-divided clock signal from the phase locked loop circuit; a low pass filter for low pass filtering an output signal from the multiplier; and an amplifier for amplifying an output signal from the low pass filter by a predetermined level and outputting the amplified signal as the first signal to the second and third means.

The second means includes a first phase delay circuit for delaying the phase of the first signal from the first means by the first desired angle and outputting the phase-delayed signal as the second signal to the fourth means; and a second phase delay circuit for delaying the phase of the synchronous reference clock signal from the synchronization network by the second desired angle and outputting the phase-delayed signal as the third signal to the fourth means, The third means includes a multiplier for multiplying the synchronous reference clock signal from the synchronization network by the first signal from the first means and outputting the multiplied result as the fourth signal to the fifth means, The fourth means includes a multiplier for multiplying the second signal from the second means by the third signal from the second means and outputting the multiplied result as the fifth signal to the fifth means, The fifth means includes an adder for adding the fourth signal from the third means to the fifth signal from the fourth means; and a counter for performing a counting operation in response to an output signal from the adder to generate the sixth signal and outputting the generated sixth signal to the phase locked loop circuit, The first phase delay circuit delays the phase of the first signal from the first means by 90° and outputs the phase-delayed signal as the second signal to the fourth means, The second phase delay circuit delays the phase of the synchronous reference clock signal from the synchronization network by 90° and outputs the phase-delayed signal as the third signal to the fourth means.

The amplifier amplifies the output signal from the low pass filter by two times and outputs the amplified signal as the first signal to the second and third means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
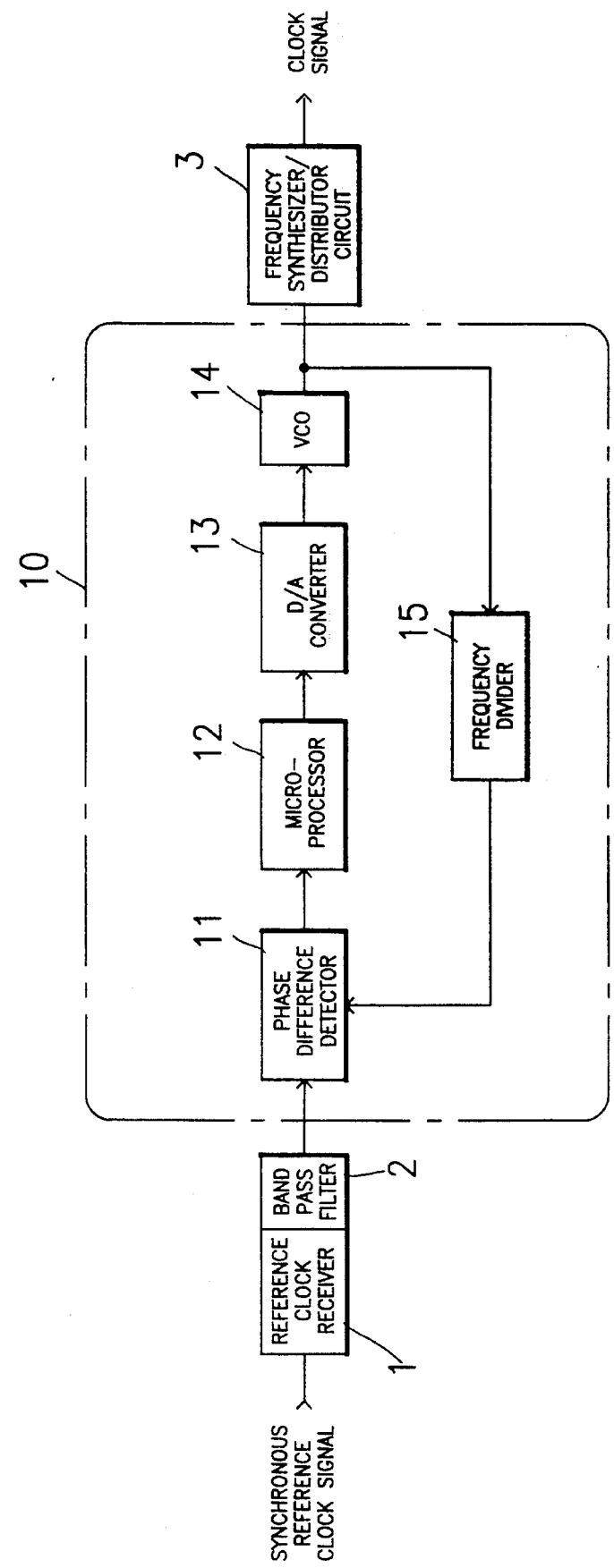
FIG. 1 is a block diagram of a conventional PLL circuit.
Figure 2:
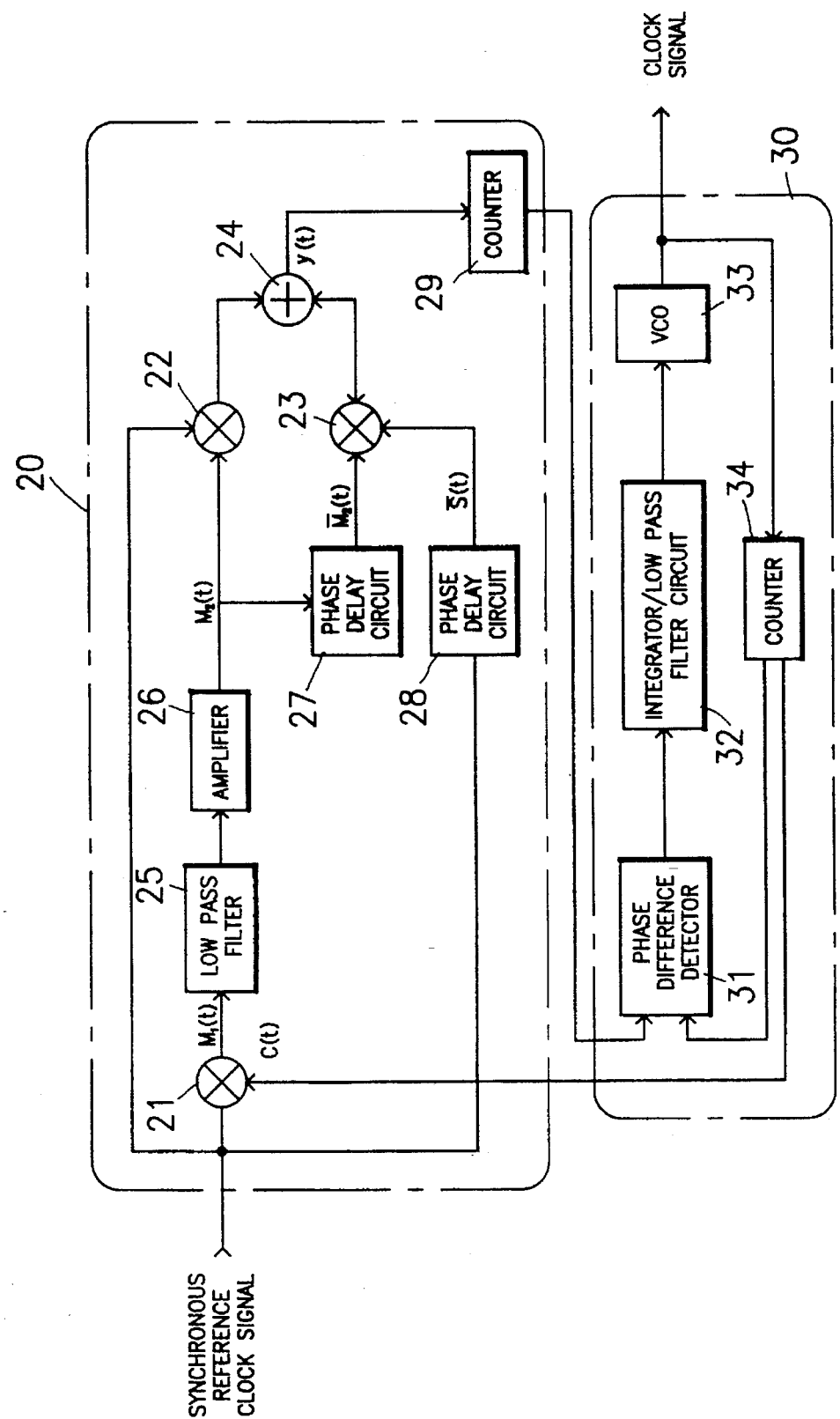
FIG. 2 is a block diagram of a PLL circuit employing a jitter suppression circuit of the present invention.

Referring to FIG. 2, there is shown a block diagram of a PLL circuit employing a jitter suppression circuit of the present invention. In this drawing, the jitter suppression circuit is designated by the reference numeral 20 and the PLL circuit is designated by the reference numeral 30. The jitter suppression circuit 20 comprises multipliers 21–23, a low pass filter 25, an amplifier 26, phase delay circuits 27 and 28, a counter 29 and an adder 24. The PLL circuit 30 comprises a phase difference detector 31, an integrator/low pass filter circuit 32, a VCO 33 and a counter 34.

Upon receiving a synchronous reference clock signal containing a jitter component, supplied from a synchronization network, the jitter suppression circuit 20 removes the jitter component therefrom to supply a pure synchronous reference clock signal to the PLL circuit 30. In the PLL circuit 30, the counter 34 performs a counting operation in response to a clock signal from the VCO 33 to divide the frequency thereof. The phase difference detector 31 detects the phase difference between the frequency-divided clock signal from the counter 34 and the synchronous reference clock signal from the jitter suppression circuit 20. As a result of the detection, the phase difference detector 31 supplies a phase difference detect signal to the integrator/low pass filter circuit 32. The integrator/low pass filter circuit 32 integrates and low pass filters the phase difference detect signal from the phase difference detector 31 to generate a voltage for the control of the VCO 33. The VCO 33 controls a phase of its output clock signal in response to the control voltage from the integrator/low pass filter circuit 32.

In the jitter suppression circuit 20, the multiplier 21 multiplies the synchronous reference clock signal from the synchronization network by the frequency-divided clock signal from the counter 34 and supplies the multiplied result to the low pass filter 25. The low pass filter 25 low pass filters an output signal from the multiplier 21 and supplies the low pass filtered signal to the amplifier 26, which amplifies the supplied signal by two times and applies the amplified signal to the multiplier 22 and the phase delay circuit 27. The multiplier 22 multiplies the synchronous reference clock signal from the synchronization network by an output signal from the amplifier 26 and supplies the multiplied result to the adder 24. The phase delay circuit 27 delays a phase of the output signal from the amplifier 26 by 90°. The phase delay circuit 28 delays a phase of the synchronous reference clock signal from the synchronization network by 90°. The multiplier 23 multiplies an output signal from the phase delay circuit 27 by an output signal from the phase delay circuit 28 and supplies the multiplied result to the adder 24. The adder 24 adds an output signal from the multiplier 22 to an output signal from the multiplier 23 and applies the added result to the counter 29. The counter 29 performs a counting operation in response to an output signal from the adder 24 to produce the pure synchronous reference clock signal to be supplied to the phase difference detector 31 in the PLL circuit 31.

The operation of the jitter suppression circuit 20 with the above-mentioned construction in accordance with the present invention will hereinafter be described in detail.

When the synchronous reference clock signal S (t) which is supplied from the synchronization network to the multiplier 21 contains the jitter component, it can be expressed by the following equation 1:

$$S(t)=\cos(w_{ct}+k_f \int J(\tau)d\tau) \tag{1}$$

where, $k_f \int J(\tau)d\tau$ is the jitter component.

The frequency-divided clock signal C(t) which is supplied from the counter 34 in the PLL circuit 30 to the multiplier 21 can be expressed by the following equation 2:

$$C(t)=\cos(w_{ct}+\epsilon) \tag{2}$$

where, e is the phase difference between the clock signals S(t) and C(t).

The multiplier 21 multiplies the synchronous reference clock signal S(t) of the equation 1 by the frequency-divided clock signal C (t) of the equation 2 and supplies the multiplied result to the low pass filter 25. In this case, the output signal $M_1$ (t) from the multiplier 21 can be expressed by the following equation 3:

$$\begin{aligned} M_1(t) &= S(t) \cdot C(t) = \cos[w_{ct}+\epsilon] \cdot \cos(w_{ct}+k_f \int J(\tau)d\tau) \\ &= 1/2 \{\cos(2w_{ct}+\epsilon+k_f \int J(\tau)d\tau)+\cos(k_f \int J(\tau)d\tau-\epsilon)\} \end{aligned} \tag{3}$$

When the output signal $M_1(t)$ from the multiplier 21 is low pass filtered by the low pass filter 25, the first term of the equation 3 is removed. The amplifier 26 amplifies the output signal from the low pass filter 25 by two times and supplies the amplified signal to the multiplier 22 and the phase delay circuit 27. In this case, the output signal $M_2(t)$ from the amplifier 26 can be given as follows:

$$M_2(t)=\cos(k_f \int J(\tau)d\tau-\epsilon) \tag{4}$$

The phase delay circuit 27 delays the phase of the output signal $M_2(t)$ from the amplifier 26 by 90° and outputs the resultant signal to the multiplier 23. The phase delay circuit 28 delays the phase of the synchronous reference clock signal S(t) of the equation 1, supplied from the synchronization network, by 90° and outputs the resultant signal to the multiplier 23. The output signals $/M_2(t)$ and $/S(t)$ from the phase delay circuits 27 and 28 can be expressed by the following equations 5 and 6, respectively:

$$/M_2(t)=\sin(k_f \int J(\tau)d\tau-\epsilon) \tag{5}$$

$$/S(t)=\sin(w_{ct}+k_f \int J(\tau)d\tau-\epsilon) \tag{6}$$

The multiplier 22 multiplies the signal $M_2(t)$ of the equation 4, supplied from the amplifier 26, by the synchronous reference clock signal S(t) of the equation 1, supplied from the synchronization network, and supplies the multiplied result to the adder 24. The multiplier 23 multiplies the signal $/M_2(t)$ of the equation 5, supplied from the phase delay circuit 27, by the signal $/S(t)$ of the equation 6, supplied from the phase delay circuit 28, and supplies the multiplied result to the adder 24. The adder 24 adds the output signal from the multiplier 22 to the output signal from the multiplier 23 to produce a signal y(t) as follows:

$$\begin{aligned} y(t) &= S(t) \cdot M_2(t) + /S(t) \cdot /M_2(t) \\ &= \cos(w_{ct}+k_f \int J(\tau)d\tau) \cdot \cos(k_f \int J(\tau)d\tau-\epsilon) + \\ &\quad \sin(w_{ct}+k_f \int J(\tau)d\tau) \cdot \sin(k_f \int J(\tau)d\tau-\epsilon) \\ &= 1/2 \cos(w_{ct}+\epsilon) + 1/2 \cos(w_{ct}+\epsilon) \\ &= \cos[w_{ct}+\epsilon] \end{aligned} \tag{7}$$

As seen from the above equation 7, the adder 24 produces the output signal y(t) by removing the jitter component ($k_f \int J(\tau)d\tau$) from the synchronous reference clock signal S(t) of the equation 1. The adder 24 then supplies the produced signal y(t) to the counter 29. The counter 29 performs its counting operation in response to the output signal y(t) from the adder 24. As a result of the counting operation, the counter 29 produces the pure synchronous reference clock signal to be supplied to the phase difference detector 31 in the PLL circuit 30.

In the PLL circuit 30, the phase difference detector 31 detects the phase difference between the frequency-divided clock signal from the counter 34 and the synchronous reference clock signal from the counter 29 and supplies the resultant phase difference detect signal to the integrator/low pass filter circuit 32. The integrator/low pass filter circuit 32 integrates and low pass filters the phase difference detect signal from the phase difference detector 31 to generate the voltage for the control of the VCO 33. The VCO 33 controls the phase of its output clock signal in response to the control voltage from the integrator/low pass filter circuit 32.

It should be noted that the present invention is not limited to the above-mentioned embodiment. Namely, although the preferred embodiment of the present invention has been disclosed for illustrative purpose of removing the jitter component from the synchronous reference clock supplied to the PLL circuit used in the switching system, it can be applied to other systems employing the PLL circuit.

As apparent from the above description, according to the present invention, the jitter suppression circuit removes the jitter component contained in the synchronous reference clock signal, to supply the pure synchronous reference clock signal to the PLL circuit. Therefore, the PLL circuit can output the clock signal at a stabilized state because it can control the phase of the clock signal with no effect of the jitter component.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A jitter suppression circuit for removing a jitter component contained in a synchronous reference clock signal which is supplied from a synchronization network to a phase locked loop circuit in a switching system, said phase locked loop circuit generating a clock signal in response to the synchronous reference clock signal from said synchronization network, comprising:

first means for generating a first signal in response to the synchronous reference clock signal from said synchronization network and a frequency-divided one of the clock signal from said phase locked loop circuit;

second means for delaying a phase of the first signal from said first means by a first desired angle to generate a second signal and delaying a phase of the synchronous reference clock signal from said synchronization network by a second desired angle to generate a third signal;

third means for generating a fourth signal in response to the first signal from said first means and the synchronous reference clock signal from said synchronization network;

fourth means for generating a fifth signal in response to the second and third signals from said second means; and fifth means for generating a sixth signal in response to the fourth signal from said third means and the fifth signal from said fourth means and outputting the generated sixth signal as a synchronous reference clock signal to said phase locked loop circuit.

2. A jitter suppression circuit as set forth in claim 1, wherein said first means includes:

a multiplier for multiplying the synchronous reference clock signal from said synchronization network by the frequency-divided clock signal from said phase locked loop circuit;

a low pass filter for low pass filtering an output signal from said multiplier; and an amplifier for amplifying an output signal from said low pass filter by a predetermined level and outputting the amplified signal as the first signal to said second and third means.

3. A jitter suppression circuit as set forth in claim 1, wherein said second means includes:

a first phase delay circuit for delaying the phase of the first signal from said first means by the first desired angle and outputting the phase-delayed signal as the second signal to said fourth means; and a second phase delay circuit for delaying the phase of the synchronous reference clock signal from said synchronization network by the second desired angle and outputting the phase-delayed signal as the third signal to said fourth means.

4. A jitter suppression circuit as set forth in claim 1, wherein said third means includes a multiplier for multiplying the synchronous reference clock signal from said synchronization network by the first signal from said first means and outputting the multiplied result as the fourth signal to said fifth means.

5. A jitter suppression circuit as set forth in claim 1, wherein said fourth means includes a multiplier for multiplying the second signal from said second means by the third signal from said second means and outputting the multiplied result as the fifth signal to said fifth means.

6. A jitter suppression circuit as set forth in claim 1, wherein said fifth means includes:

an adder for adding the fourth signal from said third means to the fifth signal from said fourth means; and a counter for performing a counting operation in response to an output signal from said adder to generate the sixth signal and outputting the generated sixth signal to said phase locked loop circuit.

7. A jitter suppression circuit as set forth in claim 3, wherein said first phase delay circuit delays the phase of the first signal from said first means by 90° and outputs the phase-delayed signal as the second signal to said fourth means.

8. A jitter suppression circuit as set forth in claim 3, wherein said second phase delay circuit delays the phase of the synchronous reference clock signal from said synchronization network by 90° and outputs the phase-delayed signal as the third signal to said fourth means.

9. A jitter suppression circuit as set forth in claim 2, wherein said amplifier amplifies the output signal from said low pass filter by two times and outputs the amplified signal as the first signal to said second and third means.

* * * * *